US008510937B2

(12) United States Patent
Kawase et al.

(10) Patent No.: US 8,510,937 B2
(45) Date of Patent: Aug. 20, 2013

(54) COMPONENT MOUNTING APPARATUS AND SUBSTRATE CONVEYANCE METHOD IN COMPONENT MOUNTING APPARATUS

(75) Inventors: Takeyuki Kawase, Yamanashi (JP); Yoshiyuki Kitagawa, Yamanashi (JP); Shuzo Yagi, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/511,789

(22) PCT Filed: Nov. 29, 2010

(86) PCT No.: PCT/JP2010/006957
§ 371 (c)(1),
(2), (4) Date: May 24, 2012

(87) PCT Pub. No.: WO2011/067919
PCT Pub. Date: Jun. 9, 2011

(65) Prior Publication Data
US 2012/0285012 A1    Nov. 15, 2012

(30) Foreign Application Priority Data
Dec. 1, 2009    (JP) .................................. 2009-273068

(51) Int. Cl.
*H05K 13/04* (2006.01)
(52) U.S. Cl.
USPC ............................................. 29/832; 29/739
(58) Field of Classification Search
USPC ........................................... 29/739–743, 832
See application file for complete search history.

(56) References Cited

FOREIGN PATENT DOCUMENTS

| JP | 2000-118678 A | 4/2000 |
|----|---------------|--------|
| JP | 2003-204192 A | 7/2003 |
| JP | 2003-204193 A | 7/2003 |
| JP | 2004-031613 A | 1/2004 |
| JP | 2008-198914 A | 8/2008 |
| JP | 2009-135554 A | 6/2009 |

OTHER PUBLICATIONS

"Disk Scheduling Algorithms", Jan. 28, 2005, http://www.cs.iit.edu/~cs561/cs450/disksched/disksched.html.*
International Search Report for PCT/JP2010/006956 dated Dec. 21, 2010.
International Search Report for PCT/JP2010/006957 dated Dec. 21, 2010.

* cited by examiner

*Primary Examiner* — Livius R Cazan
(74) *Attorney, Agent, or Firm* — Pearne & Gordon LLP

(57) ABSTRACT

An object of the invention is to provide a component mounting apparatus which includes a plurality of substrate conveying lanes and which efficiently controls the order of carrying in of substrates, thereby capable of improving productivity, and also is to provide a substrate conveyance method in the component mounting apparatus. In a configuration which includes: component supplying units (20A, 20B) positioned lateral to conveyor lines including conveyors (10A, 10B, 10C, 10D) arranged in parallel; and a substrate distributing unit (M3B) configured to distribute substrates (13) delivered from an upstream apparatus, in the case where a substrate request signal (R) is output from conveyors (10B, 10C) which are farther from the component supplying units (20A, 20B), when the substrate request signal R is output for a conveyor (10D) which is closer to the component supplying unit (20*b*) prior to start of a transferring work of the new substrate (13), the new substrate (13) is carried into the conveyor (10D). Therefore, a substrate can be preferentially carried into conveyors which are more advantageous in component mounting efficiency.

2 Claims, 7 Drawing Sheets

COMPONENT MOUNTING APPARATUS AND SUBSTRATE CONVEYANCE METHOD IN COMPONENT MOUNTING APPARATUS

TECHNICAL FIELD

The present invention relates to a component mounting apparatus configured to mount a component to a substrate, and also to a substrate conveyance method in the component mounting apparatus.

BACKGROUND ART

In a component mounting apparatus which mounts components to a substrate to produce a mounting substrate, a substrate conveying mechanism for conveying a substrate from the upstream side to the downstream side is disposed, and a component mounting work of moving and mounting a component picked up from a component supplying unit is performed on a substrate conveyed by the substrate conveying mechanism and positioned and held to a substrate holding unit. For the purpose of improving the efficiency of the component mounting work, a component mounting apparatus including a substrate conveying mechanism including a plurality of substrate conveying lanes is known (for example, see Patent Document 1). The Patent Document example shows an example in which two lines of conveying apparatuses (substrate conveying lanes) having a configuration including a pair of conveyor belts arranged in parallel are provided. When this configuration is employed, a substrate conveying operation in one of the substrate conveying lanes and a component mounting operation in the other substrate conveying lane can be performed in parallel. According to the configuration, there is an advantage that interruption of the component mounting work does not occur even when a substrate is conveyed, and the productivity can be improved.

RELATED ART DOCUMENTS

Patent Documents

Patent Document 1: JP-A-2004-31613

SUMMARY OF THE INVENTION

Problem to be Solved by the Invention

In a component mounting apparatus which is provided with a plurality of substrate conveying lanes as described above, it is necessary to perform a substrate distributing control that dynamically controls a selection of one of substrate conveying lanes into which a substrate delivered from an upstream apparatus is carried in. In a conventional component mounting apparatus, it is usual to employ a method which carries in substrates into the substrate conveying lanes in the order in which a substrate request signal output for each of substrate conveying lanes, i.e., a signal indicating that a reception of a new substrate into the substrate conveying lane is enabled is output. In the above-described conventional method, however, the following disadvantages inevitably occur.

In a component mounting apparatus including a plurality of substrate conveying lanes, the distances in which a mounting head reciprocates between a component supplying unit and respective substrate holding units disposed in the substrate conveying lanes are different from one another depending on positional relationships between the substrate conveying lanes and the component supplying unit. Therefore, a remarkable difference is caused in the efficiency of the work of mounting components between the case where the mounting work is performed on a substrate located in the substrate conveying lane close to the component supplying unit, and that where the mounting work is performed on a substrate located in the substrate conveying lane far from the component supplying unit. Therefore, as the substrate conveying lane is closer to the component supplying unit, a higher efficiency of the component mounting work is realized.

However, in the conventional method, the substrate conveying lane into which a substrate is carried is determined simply based on the order of the substrate request signals. Even in the case where the substrate conveying lane closer to the component supplying unit enters the state where a reception of a new substrate is enabled, when the substrate request signal for the substrate conveying lane farther from the component supplying unit has been already output, a substrate is carried into the substrate conveying lane farther from the component supplying unit. Namely, the order of carrying in of substrates which is preferable from the viewpoint of the efficiency of the component mounting work is not always realized. This constitutes a cause for impeding improvement of the productivity.

Therefore, an object of the invention is to provide a component mounting apparatus which includes a plurality of substrate conveying lanes, and which can efficiently control the order of carrying in of substrates, thereby capable of improving productivity, and also is to provide a substrate conveyance method in the component mounting apparatus.

Means for Solving the Problem

The present invention provides a component mounting apparatus including: a conveyor line including a plurality of substrate conveying conveyors which are arranged in parallel and each of which is configured to convey a substrate and includes a substrate holding unit configured to position and hold the substrate; a component supplying unit positioned lateral to the conveyor line, and configured to supply a component to be mounted to the substrate; a substrate distributing unit configured to distribute substrates delivered from an upstream apparatus to the plurality of substrate conveying conveyors; a substrate conveyance controlling unit configured to control the substrate distributing unit and the substrate conveying conveyors, thereby performing a substrate conveying operation of carrying in the delivered substrate into the substrate holding unit of any one of the substrate conveying conveyors; a component mounting mechanism configured to pick up a component from the component supplying unit by a mounting head, and configured to mount the component to the substrate positioned and held by the substrate holding unit; and a signal outputting unit configured to determine, based on a result of a detection of existence or non-existence of a substrate in the substrate conveying conveyor, whether the substrate conveying conveyor is in a state where the substrate conveying conveyor can receive a new substrate or not, and configured to output, based on a result of the determination, a substrate request signal for requesting carrying in of the new substrate into the substrate conveying conveyor, wherein in a case where the substrate request signal is output for one of the plurality of substrate conveying conveyors which is farther from the component supplying unit, when the substrate request signal is output for one of the plurality of substrate conveying conveyors which is closer to the component supplying unit prior to start of a transferring operation of carrying the new substrate from the substrate distributing unit into the substrate conveying conveyor which is farther from the component supplying unit, the substrate conveyance controlling unit causes the new substrate to be carried into the substrate conveying conveyor which is closer to the component supplying unit.

The present invention also provides a substrate conveyance method in a component mounting apparatus, the component mounting apparatus including: a conveyor line including a plurality of substrate conveying conveyors which are arranged in parallel and each of which is configured to convey a substrate and includes a substrate holding unit configured to position and hold the substrate; a component supplying unit positioned lateral to the conveyor line, and configured to supply a component to be mounted to the substrate; a substrate distributing unit configured to distribute substrates delivered from an upstream apparatus to the plurality of substrate conveying conveyors; a substrate conveyance controlling unit configured to control the substrate distributing unit and the substrate conveying conveyors, thereby performing a substrate conveying operation of carrying in the delivered substrate into the substrate holding unit of any one of the substrate conveying conveyors; a component mounting mechanism configured to pick up a component from the component supplying unit by a mounting head, and configured to mount the component to the substrate positioned and held by the substrate holding unit; and a signal outputting unit configured to determine, based on a result of a detection of existence or non-existence of a substrate in the substrate conveying conveyor, whether the substrate conveying conveyor is in a state where the substrate conveying conveyor can receive a new substrate or not, and configured to output, based on a result of the determination, a substrate request signal for requesting carrying in of the new substrate into the substrate conveying conveyor, the method for carrying in the substrate into the substrate holding unit, including: carrying in the new substrate into one of the plurality of substrate conveying conveyor which is closer to the component supplying unit, in a case where the substrate request signal is output for one of the plurality of substrate conveying conveyors which is farther from the component supplying unit, and when the substrate request signal is output for the conveying conveyor which is closer to the component supplying unit prior to start of a transferring operation of carrying the new substrate from the substrate distributing unit into the substrate conveying conveyor which is farther from the component supplying unit.

Advantages of the Invention

According to the invention, in the configuration including: the conveyor line including the plurality of substrate conveying conveyors arranged in parallel; the component supplying unit positioned lateral to the conveyor line and configured to supply a component to be mounted to a substrate; and the substrate distributing unit configured to distribute substrates delivered from an upstream apparatus to the plurality of substrate conveying conveyors, in the case where the substrate request signal is output for one of the plurality of substrate conveying conveyors which is farther from the component supplying unit, when the substrate request signal is output for one of the plurality of substrate conveying conveyors which is closer to the component supplying unit prior to start of a transferring operation of carrying the new substrate from the substrate distributing unit into the substrate conveying conveyor which is farther from the component supplying unit, the new substrate is carried into the substrate conveying conveyor which is closer to the component supplying unit. With this configuration, the substrate can be preferentially carried into the substrate conveying conveyor which is more advantageous in component mounting efficiency. Therefore, the order of carrying in of substrates is efficiently controlled to enable the productivity to be improved.

MODE FOR CARRYING OUT THE INVENTION

Figure 1:
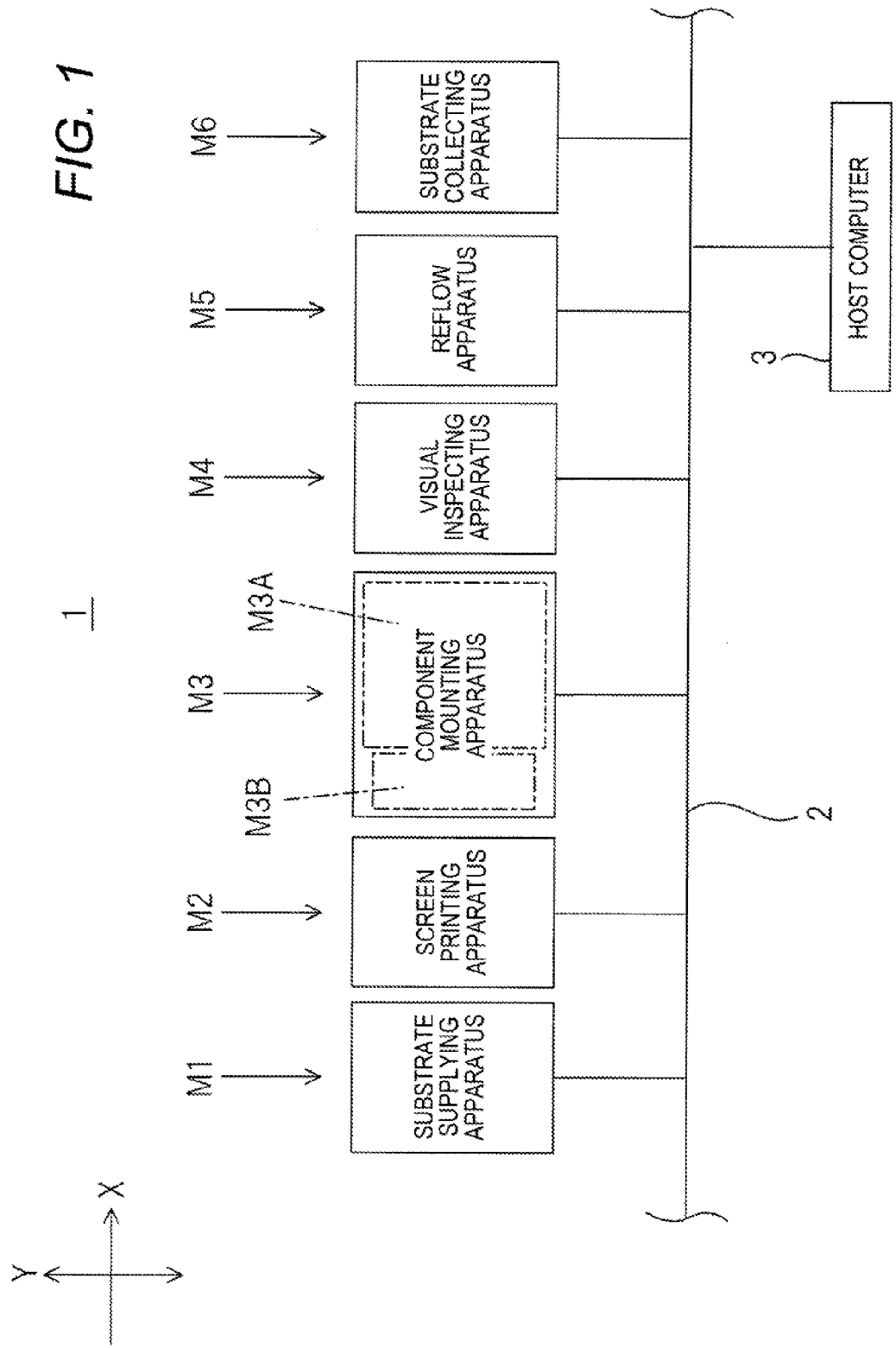
FIG. 1 is a block diagram showing the configuration of a component mounting system of an embodiment of the invention.

Next, an embodiment of the invention will be described with reference to the drawings. First, the configuration of a component mounting system 1 will be described with reference to FIG. 1. The component mounting system 1 is configured by coupling in series a plurality of apparatuses for mounting components, i.e., a substrate supplying apparatus M1, a screen printing apparatus M2, a component mounting apparatus M3, a visual inspecting apparatus M4, a reflow apparatus M5, and a substrate collecting apparatus M6, in the direction X (substrate conveying direction). Here, the component mounting apparatus M3 has a form where, on the upstream side of a component mounting mechanism unit M3A having a plurality of substrate conveying conveyors, the apparatus is accompanied by a substrate distributing unit M3B having a function of distributing substrates sent from the screen printing apparatus M2 to the substrate conveying conveyors. The apparatuses are connected to one another through a LAN 2, and working operations of the apparatuses are generally controlled by a host computer 3 which is connected to the LAN 2.

The functions of the apparatuses will be described. The substrate supplying apparatus M1 takes out a substrate to which components are to be mounted, and which is housed in a container such as a magazine, and supplies the substrate to the screen printing apparatus M2. The screen printing apparatus M2 prints a paste such as a cream solder which is a bonding material, to electrodes which are formed on the substrate, and which are to be used for component connection. The substrate in which the printing of the paste by the screen printing apparatus M2 has been ended is distributed by means of the substrate distributing unit M3B, and then carried into a specific one of the plurality of substrate conveying conveyors of the component mounting mechanism unit M3A. In the conveyor, a component mounting work of mounting an electronic component picked up from a component supplying unit to a predetermined position is performed on the carried in substrate.

The visual inspecting apparatus M4 takes an image of the substrate which has undergone the component mounting work, by a camera, to perform inspection for the purpose of determining pass/fail of the mounting state such as the existence or non-existence and positional displacement of the mounted electronic component. A substrate which is determined as a result of the inspection to pass is carried into the reflow apparatus M5. In the apparatus, the substrate is heated to fuse and solidify the cream solder, thereby solder bonding the electronic component to the electrodes of the substrate. The substrate in which the solder bonding is ended and the component mounting work is completed is collected by the substrate collecting apparatus M6.

Figure 2:
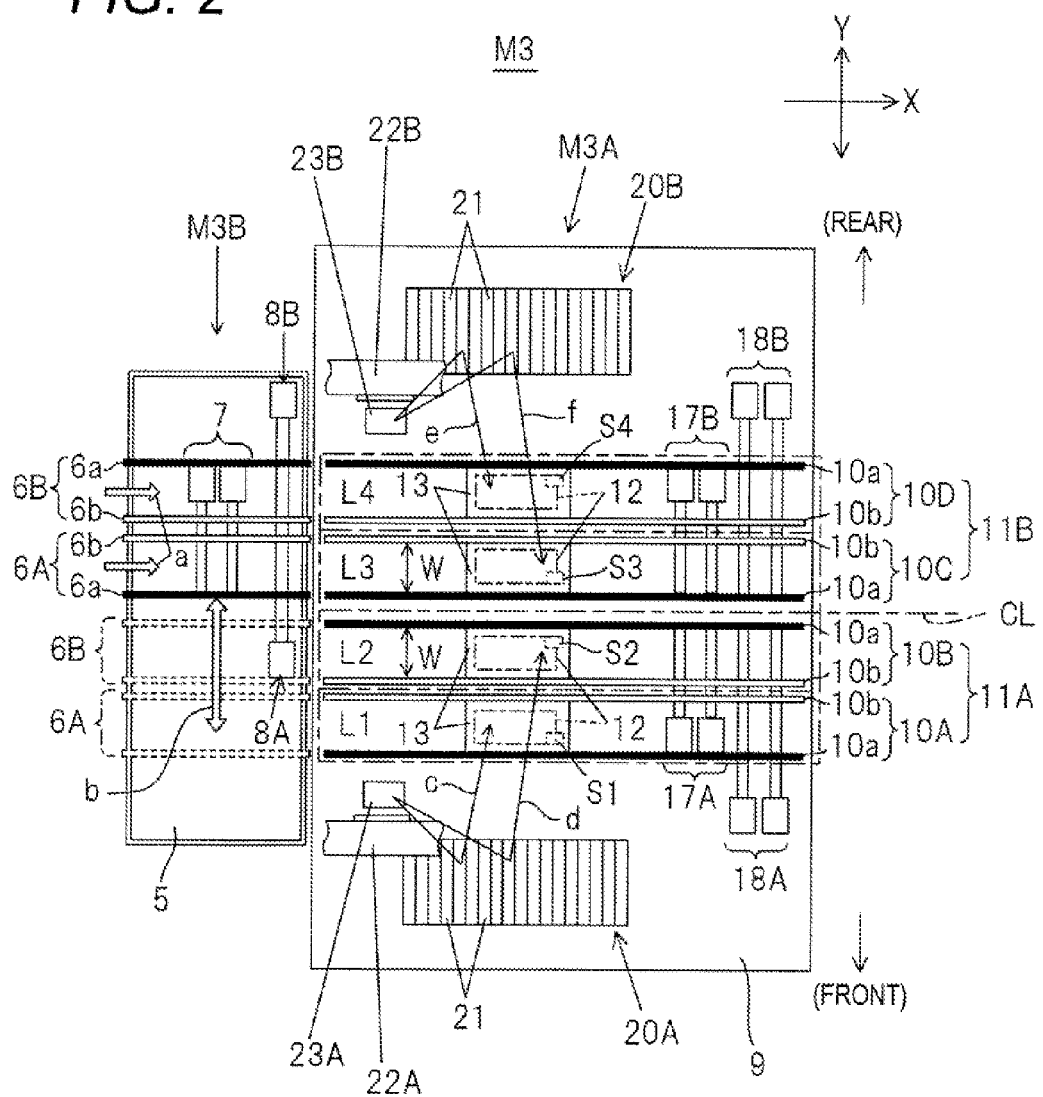
FIG. 2 is a plan view of a component mounting apparatus of the embodiment of the invention.

Next, the configuration and function of the component mounting apparatus M3 will be described with reference to FIG. 2. As described above, the component mounting apparatus M3 is configured by combining the substrate distributing unit M3B having the function of distributing substrates with the upstream side of the component mounting mechanism unit M3A which functions as a main body unit. First, the configuration of the component mounting mechanism unit M3A will be described. Referring to FIG. 2, on the upper surface of a platform 9, a front conveyor line 11A configured by a first substrate conveying conveyor 10A and a second substrate conveying conveyor 10B (hereinafter, abbreviated as "first conveyor 10A" and "second conveyor 10B"), and a rear conveyor line 11B configured by a third substrate conveying conveyor 10C and a fourth substrate conveying conveyor 10D (hereinafter, abbreviated as "third conveyor 10C" and "fourth conveyor 10D") are arranged in the direction X across the apparatus center line CL. Namely, the component mounting apparatus M3 includes the front conveyor line 11A and the rear conveyor line 11B each configured by arranging in parallel the plurality of substrate conveying conveyors which convey substrates 13.

Each of the first conveyor 10A, the second conveyor 10B, the third conveyor 10C, and the fourth conveyor 10D is configured by combining a stationary rail 10a and a movable rail 10b, and conveyor belts which are provided in the respective stationary rail 10a and movable rail 10b are driven by belt driving mechanisms 18A, 18B, whereby the substrates 13 supplied from the substrate distributing unit M3B are conveyed in the direction X.

The first conveyor 10A, the second conveyor 10B, the third conveyor 10C, and the fourth conveyor 10D constitute a first conveying lane L1, a second conveying lane L2, a third conveying lane L3, and a fourth conveying lane L4 which convey the substrates 13 that are to be mounted in the component mounting mechanism unit M3A, respectively. Substrate holding units 12 are disposed in substantially intermediate positions in the direction X of the first conveying lane L1, the second conveying lane L2, the third conveying lane L3, and the fourth conveying lane L4, respectively. The substrate holding units 12 position and hold the substrates 13 which are conveyed by the substrate conveying conveyors, respectively.

Substrate detection sensors S1, S2, S3, S4 are disposed in the respective substrate holding units 12. The substrate detection sensors detect the existence or non-existence of the substrates 13 in the corresponding substrate holding units 12 in the first conveyor 10A to the fourth conveyor 10D. Based on a result of the substrate detection, as described later, it is determined whether the substrate conveying conveyor is in a state where it can newly receive the substrate 13 or not.

In each of the first conveyor 10A, the second conveyor 10B, the third conveyor 10C, and the fourth conveyor 10D, the movable rail 10b which is located in the inner side is movable in the direction Y, and moved in the direction Y by driving inter-rail distance adjusting mechanisms 17A, 17B, whereby the conveyance width W defined by the interval between the stationary rail 10a and the movable rail 10b can be adjusted in accordance with the objective substrate 13.

A front component supplying unit 20A and a rear component supplying unit 20B are placed on the sides of the front conveyor line 11A and the rear conveyor line 11B, respectively. A plurality of parts feeders 21 which house components to be mounted to the substrates 13 are arranged in parallel with each of the front component supplying unit 20A and the rear component supplying unit 20B. In FIG. 2, the lower side of the sheet corresponds to the front side of the mounting apparatus, and the upper side corresponds to the rear side. A front mounting head 23A and rear mounting head 23B which are driven by a front head moving mechanism 22A and a rear head moving mechanism 22B, respectively are placed in the upper surface side of the platform 9.

The front mounting head 23A picks up a component from the front component supplying unit 20A, and mounts the component to the substrate 13 which is held by the substrate holding unit 12 of the first conveyor 10A or the second conveyor 10B (the arrows c, d). Similarly, the rear mounting head 23B picks up a component from the rear component supplying unit 20B, and mounts the component to the substrate 13 which is held by the substrate holding unit 12 of the fourth conveyor 10D or the third conveyor 10C (the arrows e, f). Namely, the front head moving mechanism 22A and the front mounting head 23A, and the rear head moving mechanism 22B and the rear mounting head 23B constitute component mounting mechanisms which pick up a component from the front component supplying unit 20A or the rear component supplying unit 20B by means of the mounting head, and which mount the component to the substrate 13 positioned and held by the substrate holding unit 12, respectively.

In the component mounting works of the component mounting mechanisms, since the first conveyor 10A is closer to the front component supplying unit 20A than the second conveyor 10B, and the fourth conveyor 10D is closer to the rear component supplying unit 20B than the third conveyor 10C, the head moving paths indicated by the arrows c, e are shorter than those indicated by the arrows d, f. In the component mounting work which is performed in the front conveyor line 11A, therefore, the component mounting work which is performed on the substrate 13 located in the first conveyor 10A can realize a higher efficiency of the component mounting work as compared with that which is performed on the substrate 13 located in the second conveyor 10B. In the component mounting work which is performed in the rear conveyor line 11B, similarly, the component mounting work which is performed on the substrate 13 located in the fourth conveyor 10D can realize a higher efficiency of the component mounting work as compared with that which is performed on the substrate 13 located in the third conveyor 10C. In the embodiment, as described later, therefore, the first conveyor 10A is set as a priority lane of the substrate conveyance in the front conveyor line 11A, and the fourth conveyor 10D is set as a priority lane of the substrate conveyance in the rear conveyor line 11B.

Next, the configuration of the component mounting mechanism unit M3B will be described. On a platform 5, a pair of first substrate distributing conveyor 6A and second substrate distributing conveyor 6B arranged in parallel is provided such that the conveying direction extends in the direction X. Each of the first substrate distributing conveyor 6A and the second substrate distributing conveyor 6B is configured by combining a stationary rail 6a and a movable rail 6b, and conveyor belts which are provided in the respective stationary rail 6a and movable rail 6b are driven by belt driving mechanisms 8A, 8B, whereby the substrates supplied from the upstream side (the left side in the figure) are conveyed in the direction X (the arrow a).

In each of the first substrate distributing conveyor 6A and the second substrate distributing conveyor 6B, the movable rail 6b which is located in the inner side is movable in the direction Y, and moved by driving an inter-rail distance adjusting mechanism 7 in the direction Y, whereby the conveyance width W defined by the interval between the stationary rail 6a and the movable rail 6b can be adjusted in accordance with the objective substrate 13. The first substrate distributing conveyor 6A and the second substrate distributing conveyor 6B can be integrally movable on the platform 5 in the direction Y (the arrow b) by a driving mechanism (not shown), thereby enabling the first substrate distributing conveyor 6A and the second substrate distributing conveyor 6B to be coupled with either of the two conveyor lines 11A, 11B which are disposed in the component mounting mechanism unit M3A. Namely, the substrate distributing unit M3B is a substrate distributing unit in which the substrates 13 delivered from the screen printing apparatus M2 that is an upstream apparatus are distributed to the plurality of substrate conveying conveyors of the component mounting mechanism unit M3A by combining the movements in the direction Y of the first substrate distributing conveyor 6A and the second substrate distributing conveyor 6B with the substrate conveying operations by the first substrate distributing conveyor 6A and the second substrate distributing conveyor 6B.

Figure 3:
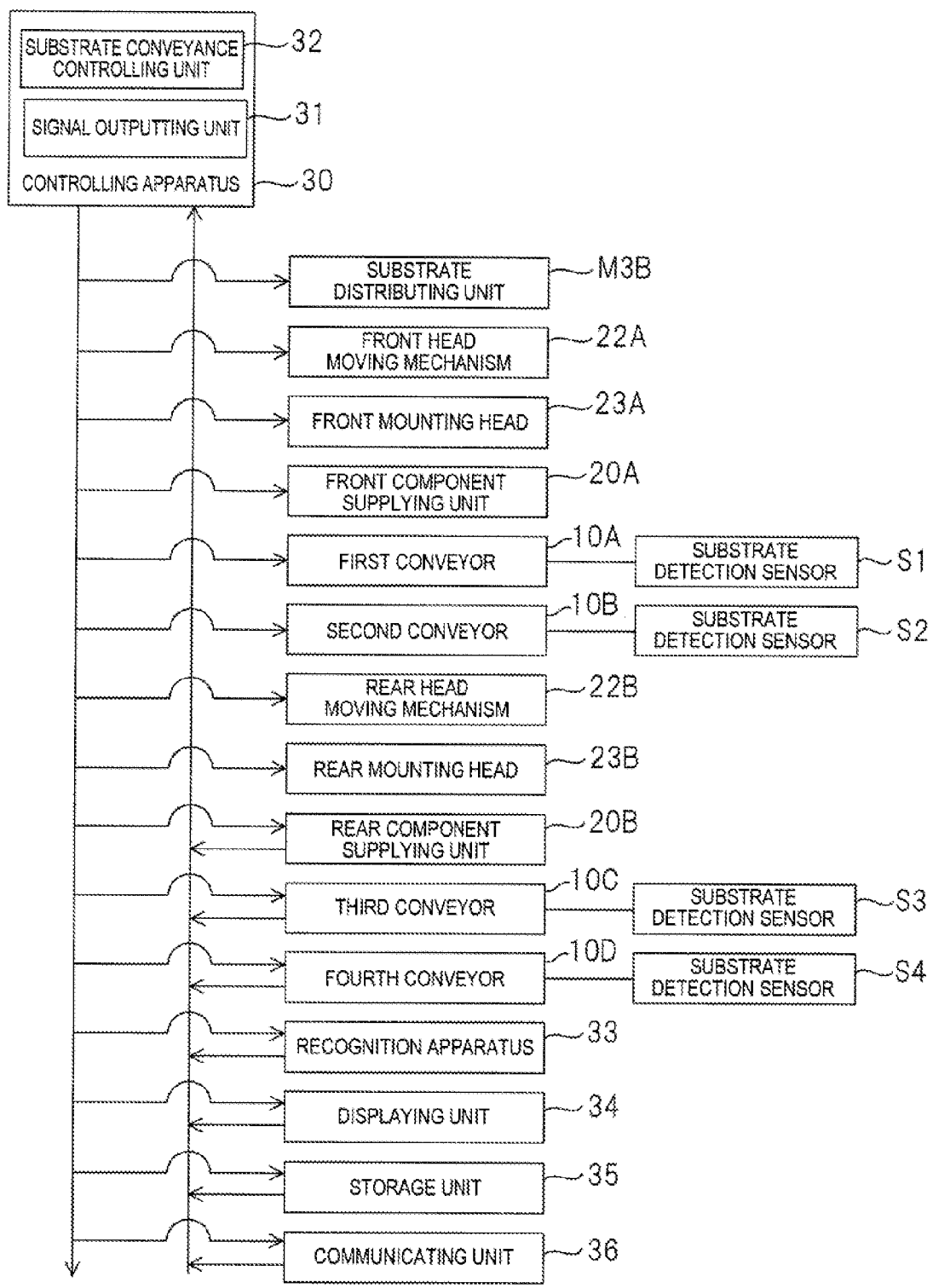
FIG. 3 is a block diagram showing the configuration of a control system of the component mounting apparatus of the embodiment of the invention.

Next, the configuration of a control system will be described with reference to FIG. 3. Referring to FIG. 3, a controlling apparatus 30 controls the units of the component mounting apparatus M3 described below. The controlling apparatus 30 includes a signal outputting unit 31 and a substrate conveyance controlling unit 32 as internal controlling functions. By the functions, the substrate conveying operation of the component mounting apparatus M3 during the operation of the component mounting system 1 is controlled. The substrate conveyance controlling unit 32 controls the substrate distributing unit M3B, the first conveyor 10A, the second conveyor 10B, the third conveyor 10C, and the fourth conveyor 10D, thereby executing the substrate conveying operation of carrying the substrate 13 delivered from the screen printing apparatus M2 on the upstream side into the substrate holding unit 12 of either of the substrate conveying conveyors.

In the substrate conveying operation, based on the results of the detections of the existence or non-existence of the substrate 13 by the substrate detection sensors S1, S2, S3, S4 which are disposed in the first conveyor 10A, the second conveyor 10B, the third conveyor 10C, and the fourth conveyor 10D, respectively, the signal outputting unit 31 determines whether the corresponding substrate conveying conveyor is in the state where it can newly receive the substrate 13 or not, and, based on the result of the determination, outputs the substrate request signal requesting the carrying in of the new substrate 13 into the substrate conveying conveyor. Here, the substrate detection sensors S1, S2, S3, S4 are disposed in the substrate holding units 12 to detect the existence or non-existence of the substrate 13 in the respective substrate holding units 12. Alternatively, similar substrate detection sensors may be disposed in downstream end portions of the first conveyor 10A to the fourth conveyor 10D, and it may be detected that the substrate 13 is completely discharged from the substrate conveying conveyor to the downstream side.

The controlling apparatus 30 controls the front head moving mechanism 22A, the front mounting head 23A, the front component supplying unit 20A, the rear head moving mechanism 22B, the rear mounting head 23B, and the rear component supplying unit 20B, thereby executing the component mounting operation on the substrates 13 carried into the first conveyor 10A, the second conveyor 10B, the third conveyor 10C, and the fourth conveyor 10D. A recognition apparatus 33 performs a recognition process on images of the substrate 13 carried into the substrate holding unit 12, and components picked up by the front mounting head 23A and the rear mounting head 23B. A displaying unit 34 is a displaying apparatus such as a liquid crystal panel, and displays an image related to predetermined items of the operation status of the host computer 3. A storage unit 35 stores data which are required for executing the substrate conveying and component mounting operations of the host computer 3. A communicating unit 36 receives and sends signals between the other apparatuses and the host computer 3 through the LAN 2.

Figure 4:
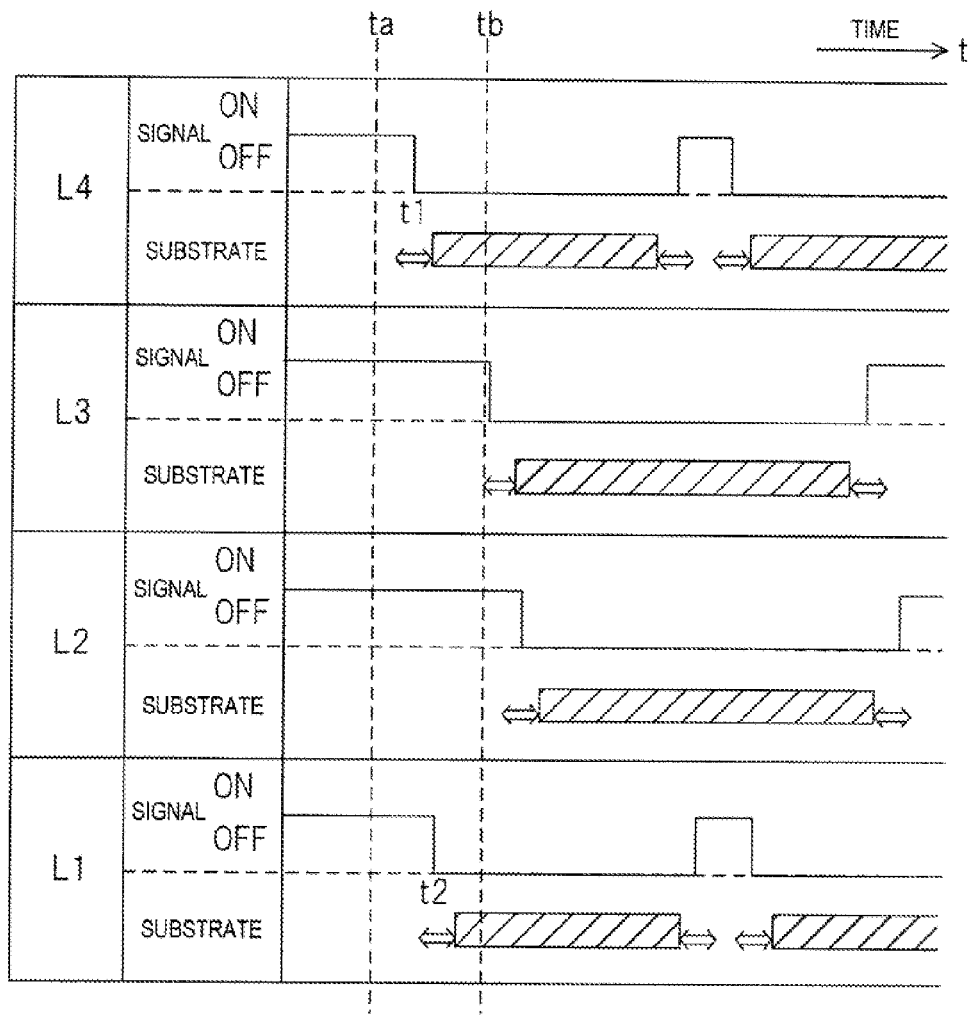
FIG. 4 is a time chart showing the order of carrying in of substrates in the component mounting apparatus of the embodiment of the invention.
Figure 5:
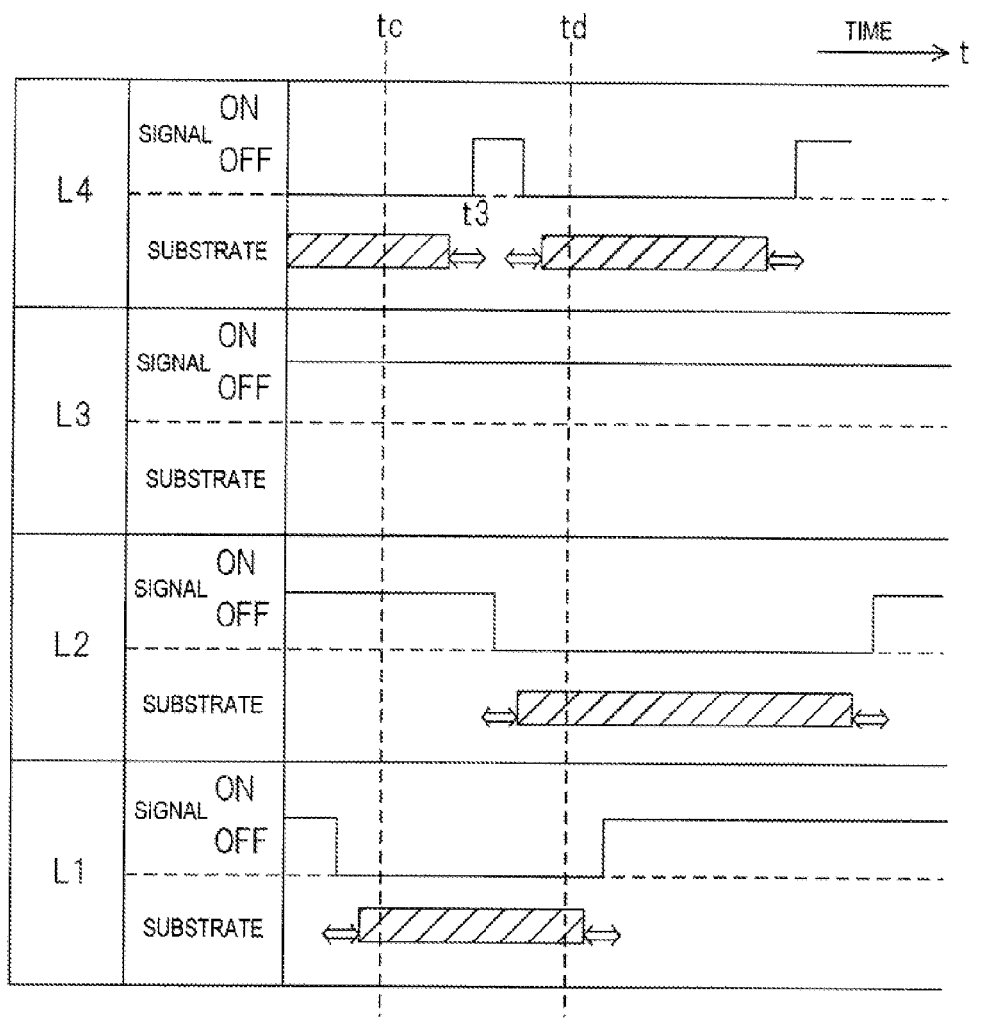
FIG. 5 is a time chart showing the order of carrying in of substrates in the component mounting apparatus of the embodiment of the invention.
Figure 6A:
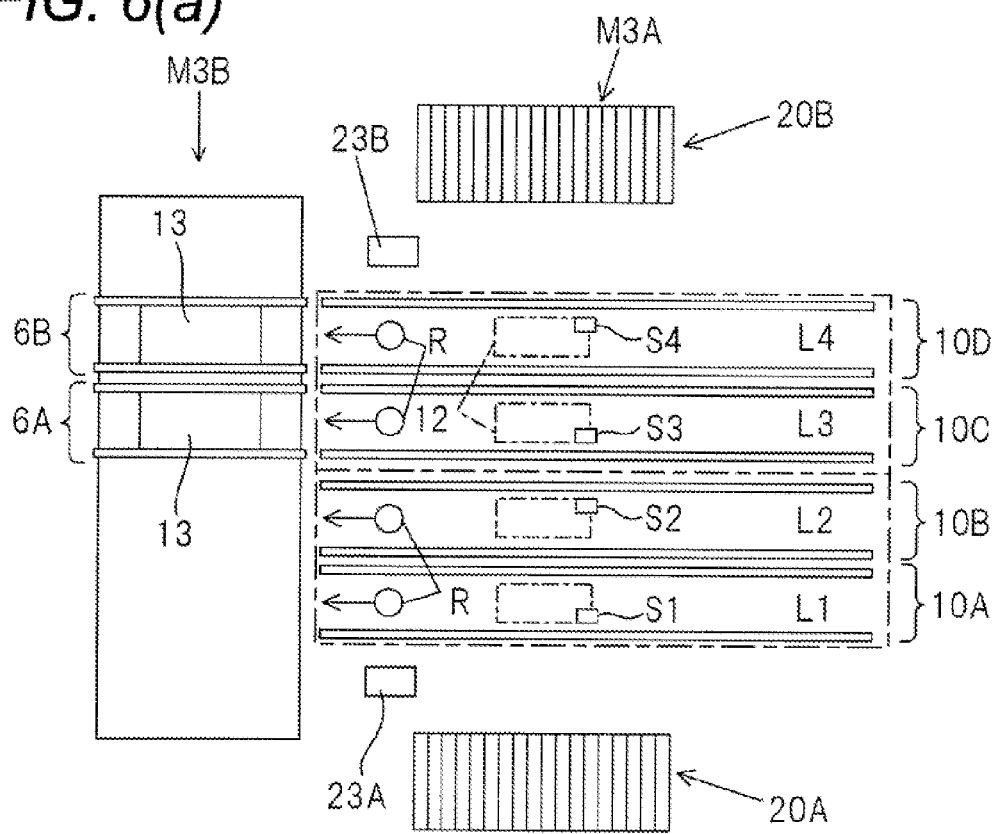
FIGS. 6(*a*) and 6(*b*) are operation diagrams of a substrate conveying operation in the component mounting apparatus of the embodiment of the invention.

Next, the substrate conveying and substrate distributing operations of the component mounting apparatus M3 will be described with reference to FIGS. 4 to 7(b). FIGS. 4 and 5 show time series relationships of the ON/OFF states of the substrate request signals R in the first conveying lane L1 to the fourth conveying lane L4, the substrate conveying operations (indicated by the double-line arrows), and the components mounting works (indicated by the hatched rectangular frames). FIGS. 6(a), (b) and FIGS. 7(a), (b) show the conveyance states of the substrates 13 in the conveying lanes at specific timings shown in FIGS. 4 and 5.

First, FIGS. 4, and 6(a), (b) show the case where the substrate conveying operation is newly started in the state where no substrate 13 is carried into the component mounting mechanism unit M3A, such as the case where the component mounting system 1 is started to operate. In this case, at timing to shown in FIG. 4, all of the substrate detection sensors S1, S2, S3, S4 do not detect the substrate 13 as shown in FIG. 6(a), and hence the substrate request signals R for all of the first conveying lane L1 to the fourth conveying lane L4 are in the ON state.

Figure 6B:
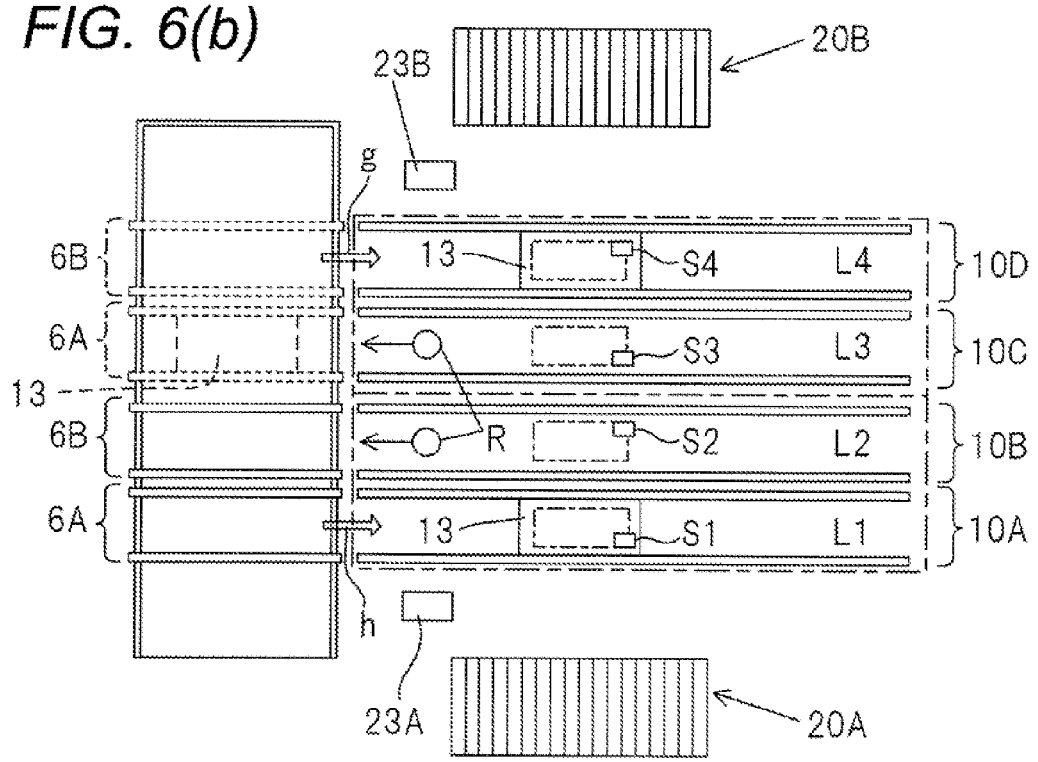

At this time, in the substrate distributing unit M3B, the substrates 13 are delivered from the upstream side to the first substrate distributing conveyor 6A and the second substrate distributing conveyor 6B, respectively, and the substrates 13 are carried into the component mounting mechanism unit M3A in accordance with the preset carry priority order. As shown in FIG. 6(b), namely, the substrate 13 held by the substrate distributing unit M3B is carried from the second substrate distributing conveyor 6B into the fourth conveying lane L4 (the arrow g), and then next substrate is carried from the first substrate distributing conveyor 6A into the first conveying lane L1 (the arrow h). FIG. 6(b) shows the state at timing tb shown in FIG. 4. In this state, as a result of the carrying in of the substrates 13, for the fourth conveying lane L4 and the first conveying lane L1, the substrate request signals R are turned OFF at respective timings t1, t2. In the third conveying lane L3 and second conveying lane L2 into which the substrate 13 has not yet been carried, the substrate request signals R remain to be in the ON state. Therefore, the new substrates 13 which are next delivered from the upstream side to the substrate distributing unit M3B are carried into the third conveying lane L3 and the second conveying lane L2.

In the example shown in FIGS. 4 and 6(a), (b), in the case where the substrate request signal R is output for a plurality of substrate conveying conveyors (the first conveyor 10A to the fourth conveyor 10D), namely, the substrate conveyance controlling unit 32 controls the substrate distributing unit M3B and the substrate conveying conveyors so that the new substrates 13 are first carried from the substrate distributing unit M3B into substrate conveying conveyors (in this example, the first conveyor 10A and the fourth conveyor 10D) which, among the substrate conveying conveyors are closest to the front component supplying unit 20A and the rear component supplying unit 20B. Therefore, the substrates 13 can be preferentially carried into substrate conveying conveyors which are close to the component supplying units, and which are more advantageous in efficiency of the component mounting work, and the order of carrying in of substrates can be efficiently controlled, so that the productivity can be improved.

Figure 7A:
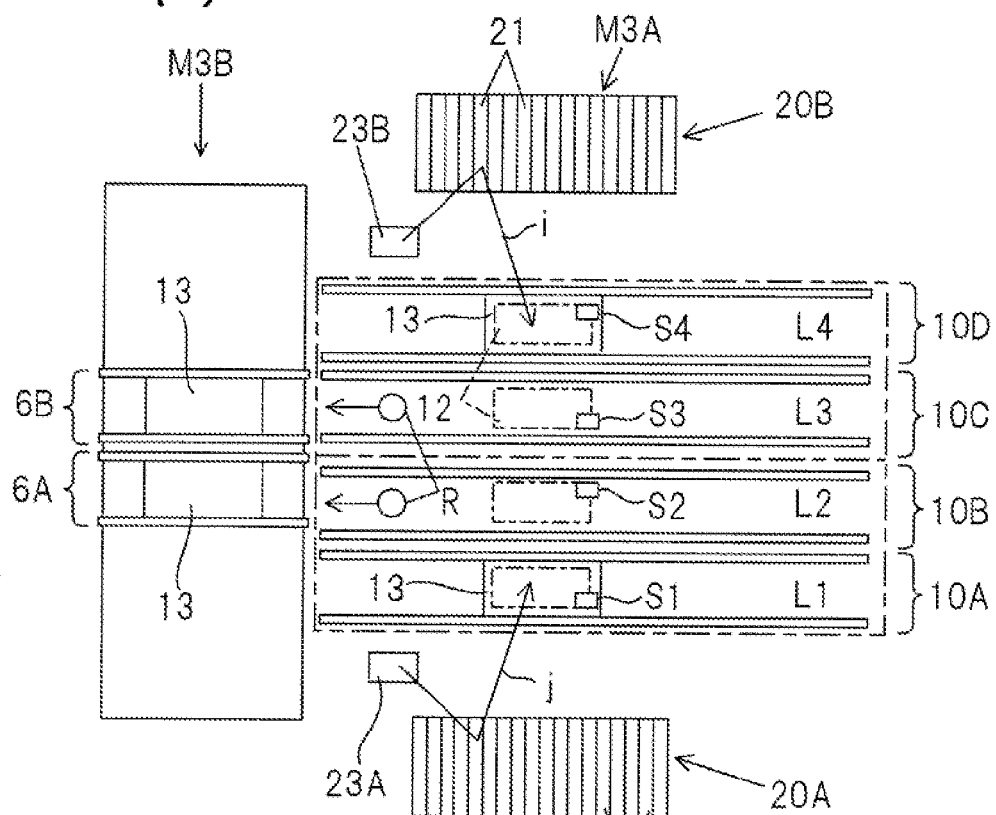
FIGS. 7(*a*) and 7(*b*) are operation diagrams of the substrate conveying operation in the component mounting apparatus of the embodiment of the invention.

Next, the substrate conveying operation in the case where the operation of the component mounting apparatus M3 in the component mounting system 1 has been already started will be described with reference to FIGS. 5 and 7(a), (b). Here, a case is shown where the substrate conveying operation is newly started in the state where the mounting works (the arrows i, j) by the rear mounting head 23B and the front mounting head 23A are performed on the substrates 13 which are carried into the fourth conveying lane L4 and the first conveying lane L1 in the component mounting mechanism unit M3A, and which are held by the substrate holding units 12. In this case, at timing tc shown in FIG. 5, as shown in FIG. 7(a), the substrate detection sensors S1, S4 detect the substrates 13, and the substrate detection sensors S3, S2 do not detect the substrates 13. For the first conveying lane L1 and the fourth conveying lane L4, therefore, the substrate request signals R are in the OFF state, and, for the second conveying lane L2 and the third conveying lane L3, are in the ON state.

At this time, in the substrate distributing unit M3B, the substrates 13 are delivered from the upstream side to the first substrate distributing conveyor 6A and the second substrate distributing conveyor 6B, respectively, and the carry destinations of the substrates 13 in delivering to the component mounting mechanism unit M3A are selected in accordance with the process degrees of the mounting works in the first conveying lane L1 and the fourth conveying lane L4. Also in the selection of the carry destinations, substrate conveying conveyors which are closer to the component supplying units, and which are more advantageous in efficiency of the component mounting work are preferentially selected.

Figure 7B:
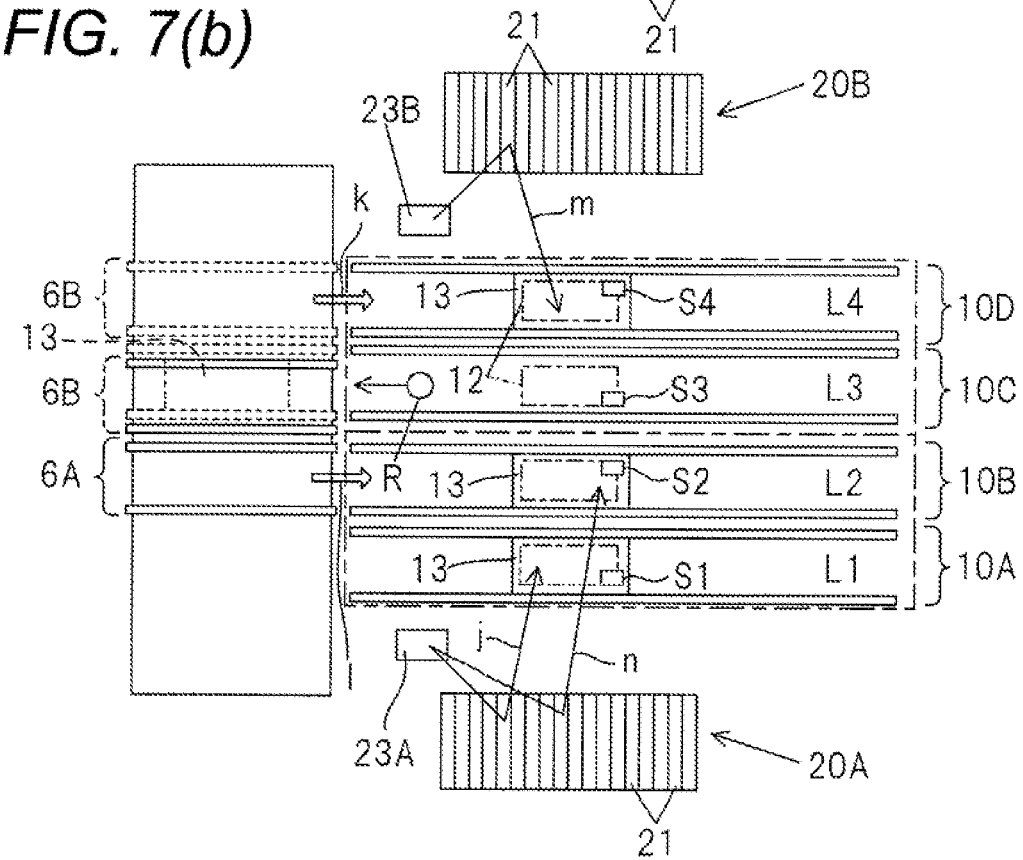

Here, an example is shown where the substrate request signal R is set to the ON state at timing t3 when the component mounting work which is performed on the substrate 13 that has been carried has been completed in the fourth conveying lane L4 and a work of transferring the substrate 13 from the second substrate distributing conveyor 6B to the component mounting mechanism unit M3A has not yet been started. In this case, although the substrate request signal R for the third conveying lane L3 is already output, the new substrate 13 is carried from the second substrate distributing conveyor 6B into the fourth conveying lane L4 as shown in FIG. 7(b) (corresponding to timing tb shown in FIG. 5) (the arrow k), and the component mounting work (the arrow m) by the rear mounting head 23B is performed on the substrate 13.

By contrast, the mounting work which is performed on the substrate 13 that has been already carried in is successively continued in the first conveying lane L1, and hence the new substrate 13 cannot be preferentially carried into the first conveying lane L1. In this case, as shown in FIG. 7(b), the new substrate 13 is carried from the first substrate distributing conveyor 6A into the second conveying lane L2 to which the substrate request signals R has been already output (the arrow i), and the component mounting work (the arrow n) by the front mounting head 23A is performed on the substrate 13.

In the example shown in FIGS. 5 and 7(a), (b), in the case where the substrate request signal R is output for a substrate conveying conveyor (in this example, the third conveyor 10C) which is farther from the rear component supplying unit 20B among the plurality of substrate conveying conveyors (the first conveyor 10A to the fourth conveyor 10D), when the substrate request signal R is output for a substrate conveying conveyor (in this example, the fourth conveyor 10D) which is closer to the rear component supplying unit 20B, before the transferring operation of carrying the new substrate 13 from the substrate distributing unit M3B into the third conveyor 10C is started, namely, the substrate conveyance controlling unit 32 controls the substrate distributing unit M3B and the substrate conveying conveyors so that the new substrate 13 is carried into the fourth conveyor 10D. Also in this case, the substrates 13 can be preferentially carried into substrate conveying conveyors which are closer to the component supplying units, and which are advantageous in component mounting efficiency, and the order of carrying in of substrates can be efficiently controlled, so that the productivity can be improved.

Although the invention has been described in detail and with reference to the specific embodiment, it is obvious to those skilled in the art that various changes and modifications can be made without departing from the spirit and scope of the invention.

The application is based on Japanese Patent Application (No. 2009-273068) filed Dec. 1, 2009, and disclosure of which is incorporated herein by reference.

INDUSTRIAL APPLICABILITY

The component mounting apparatus of the invention and the substrate conveyance method in the component mounting apparatus have an effect that substrates can be preferentially carried into a substrate conveying conveyor which is more advantageous in component mounting efficiency, and the order of carrying in of substrates can be efficiently controlled, so that the productivity can be improved, and are useful in the field of mounting electronic components to a wiring substrate to produce a mounting substrate.

DESCRIPTION OF REFERENCE SIGNS

1 Component Mounting System
10A First Conveyor
10B Second Conveyor
10C Third Conveyor
10D Fourth Conveyor
11A Front Conveyor Line
11B Rear Conveyor Line
12 Substrate Holding Unit
13 Substrate
20A Front Component Supplying Unit
20B Rear Component Supplying Unit
21 Parts Feeder
22A Front Head Moving Mechanism
22B Rear Head Moving Mechanism
23A Front Mounting Head
23B Rear Mounting Head
M3A Component Mounting Mechanism Unit
M3B Substrate Distributing Unit
L1 First Conveying Lane
L2 Second Conveying Lane
L3 Third Conveying Lane
L4 Fourth Conveying Lane
S1, S2, S3, S4 Substrate Detection Sensor

The invention claimed is:

1. A component mounting apparatus comprising:

a conveyor line comprising a plurality of substrate conveying conveyors which are arranged in parallel and each of which is configured to convey a substrate and comprises a substrate holding unit configured to position and hold the substrate;

a component supplying unit positioned lateral to the conveyor line, and configured to supply a component to be mounted to the substrate;

a substrate distributing unit configured to distribute substrates delivered from an upstream apparatus to the plurality of substrate conveying conveyors;

a substrate conveyance controlling unit configured to control the substrate distributing unit and the substrate conveying conveyors, thereby performing a substrate conveying operation of carrying in a delivered substrate into the substrate holding unit of any one of the substrate conveying conveyors;

a component mounting mechanism configured to pick up a component from the component supplying unit by a mounting head, and configured to mount the component to the substrate positioned and held by the substrate holding unit; and a signal outputting unit configured to determine, based on a result of a detection of existence or non-existence of a substrate in the substrate conveying conveyor, whether the substrate conveying conveyor is in a state where the substrate conveying conveyor can receive a new substrate or not, and configured to output, based on a result of the determination, a substrate request signal for requesting carrying in of the new substrate into the substrate conveying conveyor, wherein in a case where the substrate request signal is output for one of the plurality of substrate conveying conveyors which is farther from the component supplying unit, if the substrate request signal is output for one of the plurality of substrate conveying conveyors which is closer to the component supplying unit based on the result of the determination prior to start of a transferring operation of carrying the new substrate from the substrate distributing unit into the substrate conveying conveyor which is farther from the component supplying unit, the substrate conveyance controlling unit causes the new substrate to be carried into the substrate conveying conveyor which is closer to the component supplying unit in preference to the substrate conveying conveyor which is farther from the component supplying unit, irrespective of a distance between any of the plurality of substrate conveying conveyors and a current position of the substrate distributing unit.

2. A substrate conveyance method in a component mounting apparatus, the component mounting apparatus comprising: a conveyor line comprising a plurality of substrate conveying conveyors which are arranged in parallel and each of which is configured to convey a substrate and comprises a substrate holding unit configured to position and hold the substrate; a component supplying unit positioned lateral to the conveyor line, and configured to supply a component to be mounted to the substrate; a substrate distributing unit configured to distribute substrates delivered from an upstream apparatus to the plurality of substrate conveying conveyors; a substrate conveyance controlling unit configured to control the substrate distributing unit and the substrate conveying conveyors, thereby performing a substrate conveying operation of carrying in a delivered substrate into the substrate holding unit of any one of the substrate conveying conveyors; a component mounting mechanism configured to pick up a component from the component supplying unit by a mounting head, and configured to mount the component to the substrate positioned and held by the substrate holding unit; and a signal outputting unit configured to determine, based on a result of a detection of existence or non-existence of a substrate in the substrate conveying conveyor, whether the substrate conveying conveyor is in a state where the substrate conveying conveyor can receive a new substrate or not, and configured to output, based on a result of the determination, a substrate request signal for requesting carrying in of the new substrate into the substrate conveying conveyor, said method for carrying in the substrate into the substrate holding unit, comprising:

carrying in the new substrate into one of the plurality of substrate conveying conveyor which is closer to the component supplying unit in preference to the substrate conveying conveyor which is farther to the component supplying unit, in a case where the substrate request signal is output for one of the plurality of substrate conveying conveyors which is farther from the component supplying unit, and if the substrate request signal is output for the conveying conveyor which is closer to the component supplying unit based on the result of the determination prior to start of a transferring operation of carrying the new substrate from the substrate distributing unit into the substrate conveying conveyor which is farther from the component supplying unit, irrespective of a distance between any of the plurality of substrate conveying conveyors and a current position of the substrate distributing unit.

* * * * *